United States Patent
Cheng

(10) Patent No.: US 11,830,780 B2
(45) Date of Patent: Nov. 28, 2023

(54) ELECTRICAL CONNECTOR ASSEMBLY AND PICK-UP CAP

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Shan-Yong Cheng, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 512 days.

(21) Appl. No.: 17/135,907

(22) Filed: Dec. 28, 2020

(65) Prior Publication Data

US 2021/0202331 A1    Jul. 1, 2021

(30) Foreign Application Priority Data

Dec. 27, 2019   (CN) .......................... 201911376778.1

(51) Int. Cl.
*H01R 12/70*   (2011.01)
*H01R 12/71*   (2011.01)
(Continued)

(52) U.S. Cl.
CPC ........ *H01L 23/053* (2013.01); *H01L 21/4803* (2013.01); *H01L 23/4093* (2013.01);
(Continued)

(58) Field of Classification Search
CPC .......................... H01R 13/514; H01R 12/716; H01R 13/5213; H01R 12/7017; H01R 12/7023;
(Continued)

(56) References Cited

U.S. PATENT DOCUMENTS

| 7,534,114 | B2 * | 5/2009 | Liao ................... | H01R 13/5213 439/135 |
| 8,998,623 | B2 | 4/2015 | Hsu | |

(Continued)

FOREIGN PATENT DOCUMENTS

| CN | 201029133 Y | 2/2008 |
| CN | 207069110 U | 7/2017 |

*Primary Examiner* — Oscar C Jimenez
*Assistant Examiner* — Paul D Baillargeon
(74) *Attorney, Agent, or Firm* — Ming Chieh Chang

(57) ABSTRACT

An electrical connector is essentially composed of a pair of half housings opposite to each other in a longitudinal direction to commonly form a receiving cavity for receiving a CPU. Each half housing is equipped with a plurality of contacts with corresponding contacting sections upwardly extending into the receiving cavity for mating with the CPU. A single pick-up cap includes a plate with a plurality of claws adapted to be engaged within locking recesses in exterior sides of the half housings, a plurality of positioning blocks adapted to extend into the receiving cavity so as to cooperate with the claws to sandwich the periphery wall of the housing therebetween in the longitudinal direction for securing the half housings to the pick-up cap. Therefore, both the pair of half housings may be grasped by the single pick-up cap for mounting and soldering to PCB at the same time.

19 Claims, 7 Drawing Sheets

(51) Int. Cl.
*H01R 13/514* (2006.01)
*H01L 23/053* (2006.01)
*H01L 21/48* (2006.01)
*H01L 23/40* (2006.01)

(52) U.S. Cl.
CPC ....... *H01R 12/7017* (2013.01); *H01R 12/716* (2013.01); *H01R 13/514* (2013.01)

(58) Field of Classification Search
CPC .................. H01L 23/053; H01L 23/4093; H01L 21/4803
See application file for complete search history.

(56) References Cited

U.S. PATENT DOCUMENTS

| | | | |
|---|---|---|---|
| 9,131,613 B2 * | 9/2015 | Hsu | H05K 7/1061 |
| 10,236,617 B2 | 3/2019 | Hsu et al. | |
| 10,411,390 B2 * | 9/2019 | Wu | H01R 13/5213 |

* cited by examiner

ELECTRICAL CONNECTOR ASSEMBLY AND PICK-UP CAP

BACKGROUND OF THE INVENTION

1. Field of the Invention

The present invention relates to an electrical connector for use with a CPU (Central Processing Unit), and particularly to the electrical connector which is essentially composed of two opposite parts spaced from each other with a gap therebetween while being commonly assembled upon a PCB (Printed Circuit Board) by a single pick-up cap simultaneously.

2. Description of Related Arts

U.S. Pat. No. 8,998,623 discloses an electrical connector essentially composed of a pair of half housings opposite to each other to commonly form a receiving cavity for receiving a CPU therein. Understandably, the reason why the electrical connector requires a pair of half housings instead of a single complete housing is to avoid the potential housing warpage due to improper shrinkage after injection molding when the number of the connector contact is relatively high and the connector housing is relatively large for high speed transmission. Therefore, a pair of pick-up caps are discrete from each other for respectively engaging the corresponding half housings, and a pair of additional clips secure the pair of half pick-up caps so as to allow the operator to move the pair of pick-up caps and the associated pair of half housings simultaneously for mounting the pair of half housings on the PCB at one time. Clearly, using the four-piece grasping device, i.e., the pair of pick-up caps and the pair of clips, in an odd manner for mounting the pair of half housings on the PCB may not an economic way.

Therefore, it is desired to provide a single piece pick-up cap for simultaneously holding the pair of half housings and mounting upon the PCB at the same time in an efficient way, is desired.

SUMMARY OF THE INVENTION

To achieve the above object, an electrical connector is essentially composed of a pair of half housings discrete from and opposite to each other in a longitudinal direction to commonly form a receiving cavity for receiving a CPU. Each half housing is equipped with a plurality of contacts with corresponding contacting sections upwardly extending into the receiving cavity for mating with the CPU. A gap is formed between the pair of half housings in the longitudinal direction. A single pick-up cap includes a plate with a plurality of claws adapted to be engaged within locking recesses in exterior sides of the half housings, and a plurality of positioning blocks adapted to extend into the receiving cavity so as to cooperate with the claws to sandwich the periphery wall of the housing therebetween in the longitudinal direction for securing the half housings to the pick-up cap. Therefore, both the pair of half housings may be simultaneously grasped by the single pick-up cap for mounting and soldering to the PCB at the same time.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
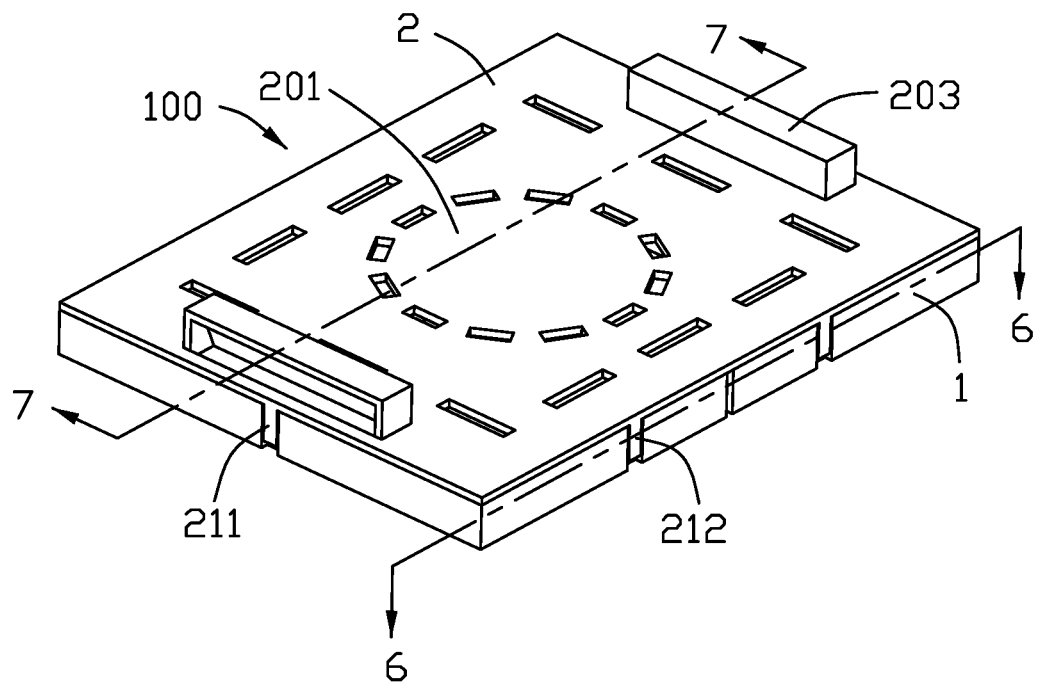
FIG. 1 is a perspective view of an electrical connector assembly including the electrical connector and the associated pick-up cap of the invention.
Figure 2:
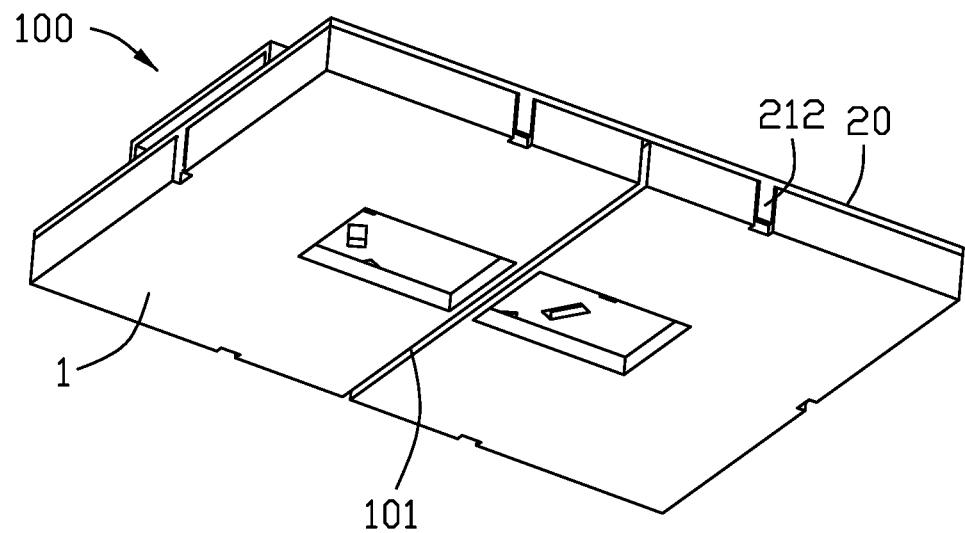
FIG. 2 is another perspective view of the electrical connector assembly of FIG. 1.

Referring to FIGS. 1-7, an electrical connector 100 for receiving a CPU or electronic package (not shown), includes a pair of insulative half housings 1 discrete from and opposite to each other in a longitudinal direction with a gap 101 therebetween, and a single pick-up cap 2 assembled thereto. A plurality of contacts (not shown) are disposed in each half housing 1. The pair of half housing 1 commonly forms an upward facing receiving cavity 10 for receiving the CPU. The contacting sections of the contacts upwardly extend into the receiving cavity for mechanically and electrically connecting to the CPU. The gap 101 may forgive the possible expansion of the half housing 1 during soldering.

The pick-up cap 2 includes a rectangular plate 20 which is configured with a pair of long sides extending along the longitudinal direction, and a pair of short sides extending along the transverse direction perpendicular to the longitudinal direction, and is dimensioned to cover both half housings 1 when assembled. A plurality of claws 21 extend downwardly from edge regions of the plate 20. The claws 21 include a pair of first claws 211 located at the short sides and two pair so of second claws 212 located at the long sides.

Each half housing 1 includes a first side wall 11 extending along the transverse direction, and a pair of second side walls 12 extending along the longitudinal direction so as to constitute a U-shaped periphery wall in a top view. Notably, the dimension of the receiving cavity 10 along the longitudinal direction is defined by the first side walls of the pair of half housings 1, and the dimension of the receiving cavity 10 along the transverse direction is defined by the pair of second side walls 12 of each half housing 1.

The pick-up cap 2 further includes a plurality of poisoning blocks 22 downwardly extending from the plate 21 into the receiving cavity 10 around the edge regions of the short sides so as to cooperate with the corresponding first claws 211 to sandwich the first side wall 11 therebetween in the longitudinal direction, thus assuring securement between the pick-up cap 2 and the half housing 1. In this embodiment, the first claw 211 is located at the longitudinal centerline of the half housing 1 and the pair of positioning blocks 22 are symmetrically located by two sides of the first claw 211, thus assuring force balance.

Figure 3:
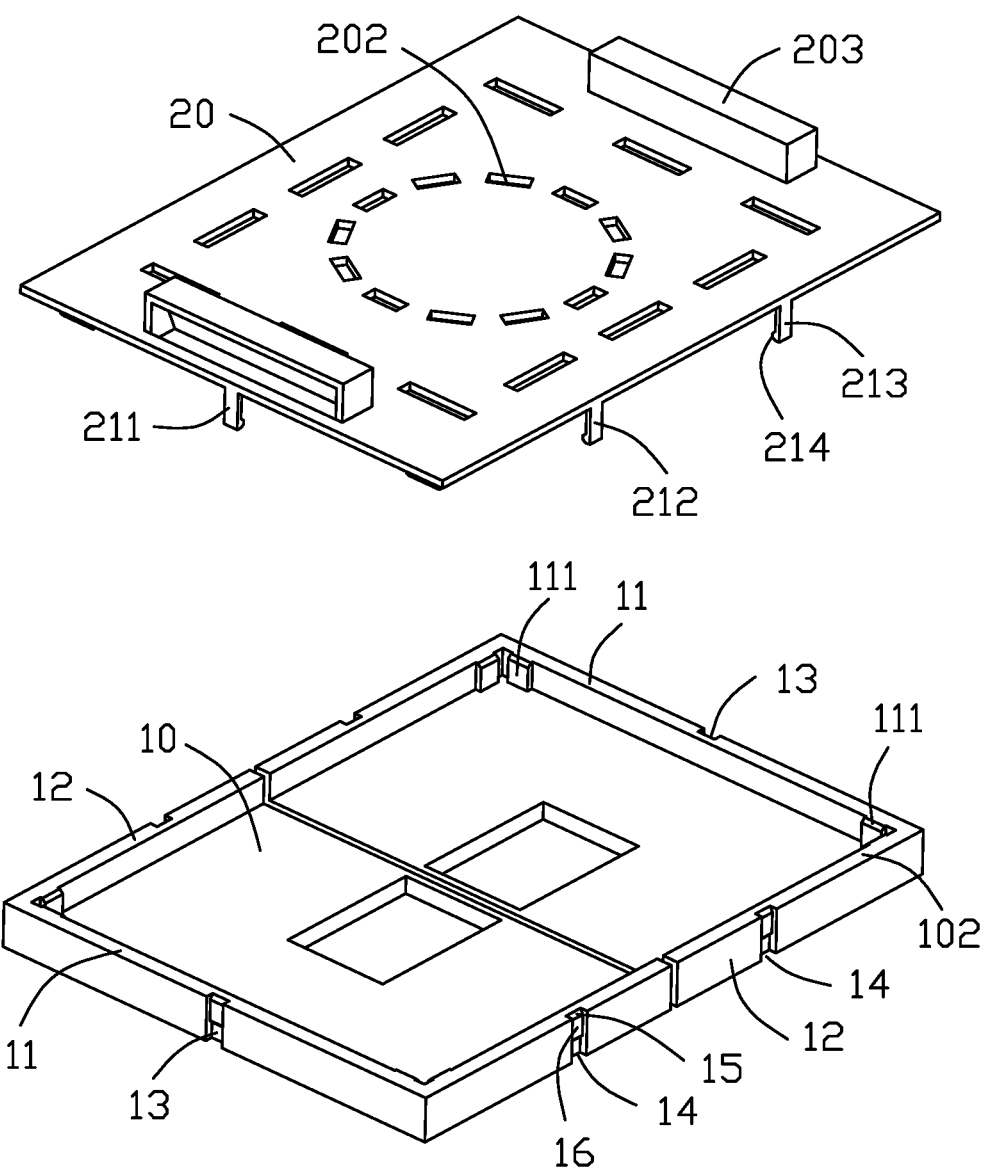
FIG. 3 is an exploded perspective view of the electrical connector assembly of FIG. 1.
Figure 4:
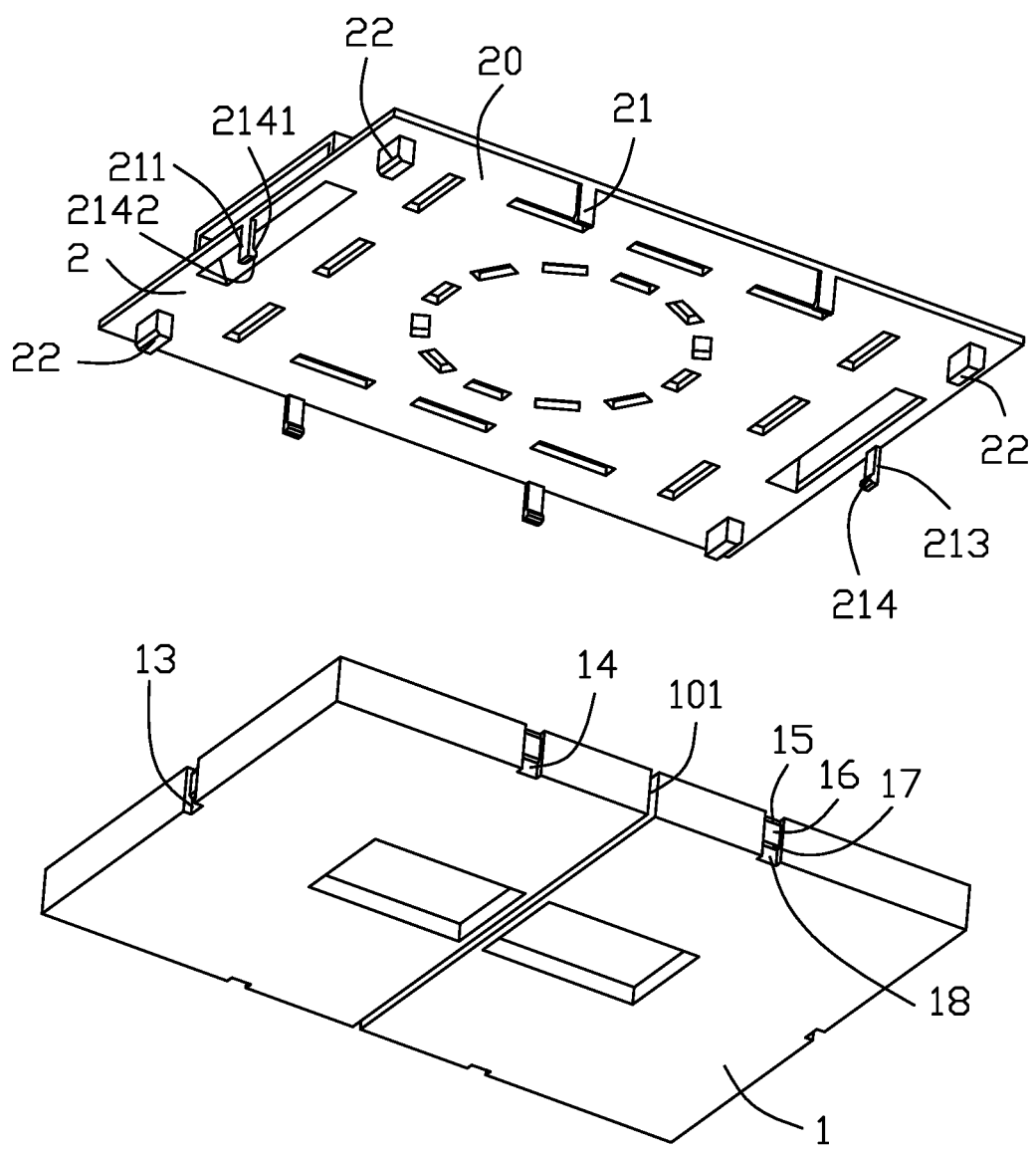
FIG. 4 is another exploded perspective view of the electrical connector assembly of FIG. 3.

As shown in FIGS. 3-6, each half housing 1 includes a first locking recess 13 in the first side wall 11 for engagement with the corresponding first claw 211, and a pair of second locking recesses 14 in the pair of second side walls 12 for engagement with the corresponding pair of second claws 212. Referring to FIGS. 3-4 and 7, each first locking recess 13 or each second locking recess 14 includes a first oblique upward guiding face 15 and a first abutting face 16 in an upper portion thereof, and a second oblique downward locking face 17 and a second abutting face 18 in a lower portion thereof. Correspondingly, each first claw 211 or each second claw 212 includes a spring arm 213 and a locking head 214 at the bottom end thereof. The locking head 214 includes an oblique upward locking face 2141 corresponding to the oblique downward locking face 17, and an oblique downward guiding face 2142 corresponding to the oblique upward guiding face 15.

When assembled, the plate 20 of the pick-up cap 2 is seated upon the upper surface 102 of the half housing 10, the spring arm 213 abuts against the first abutting face 16 in the locking recess 13 or 14, the oblique upward locking face 2141 of the locking head 214 upwardly abuts against the corresponding oblique downward locking face 17, and the locking head 214 intimately confronts the second abutting face 18. Therefore, the first claw 211 or the second claw 212 may be snugly retained in the corresponding locking recess 13 or 14 without relative movement either in the vertical direction or the transverse direction.

Figure 5:
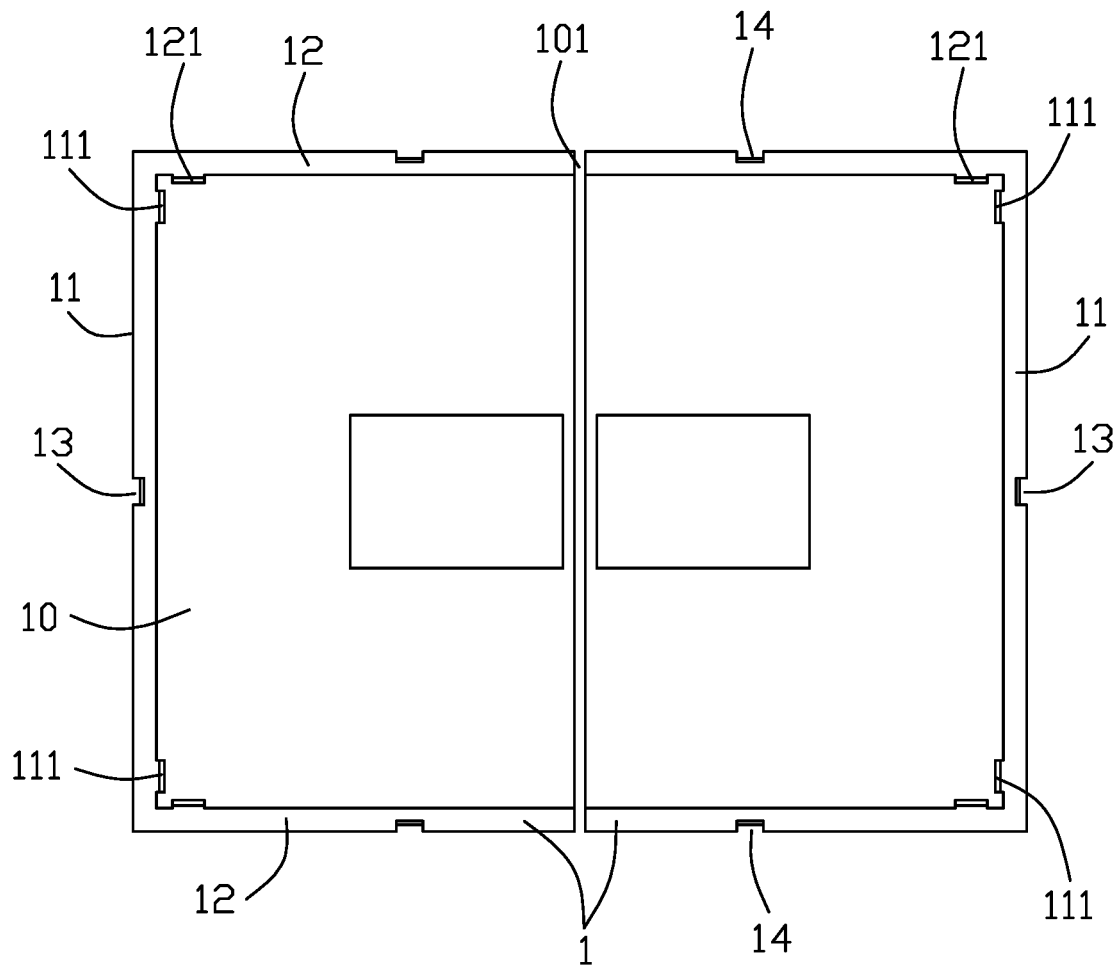
FIG. 5 is a top view of the electrical connector of FIG. 3.
Figure 6:
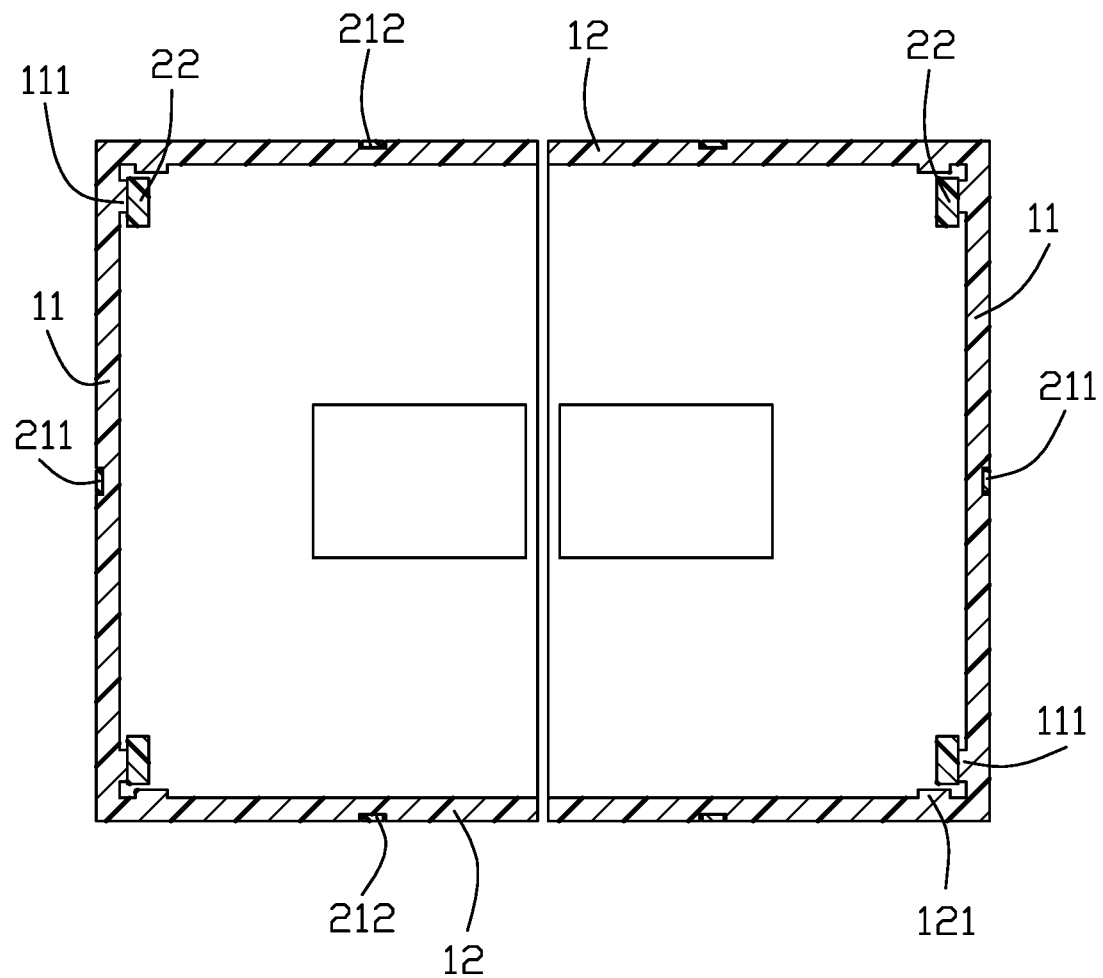
FIG. 6 is a cross-sectional view of the electrical connector assembly of FIG. 1 to shown how the positioning blocks cooperate with the claws to sandwich the corresponding periphery wall of the half housing therebetween in the longitudinal direction for securement.
Figure 7:
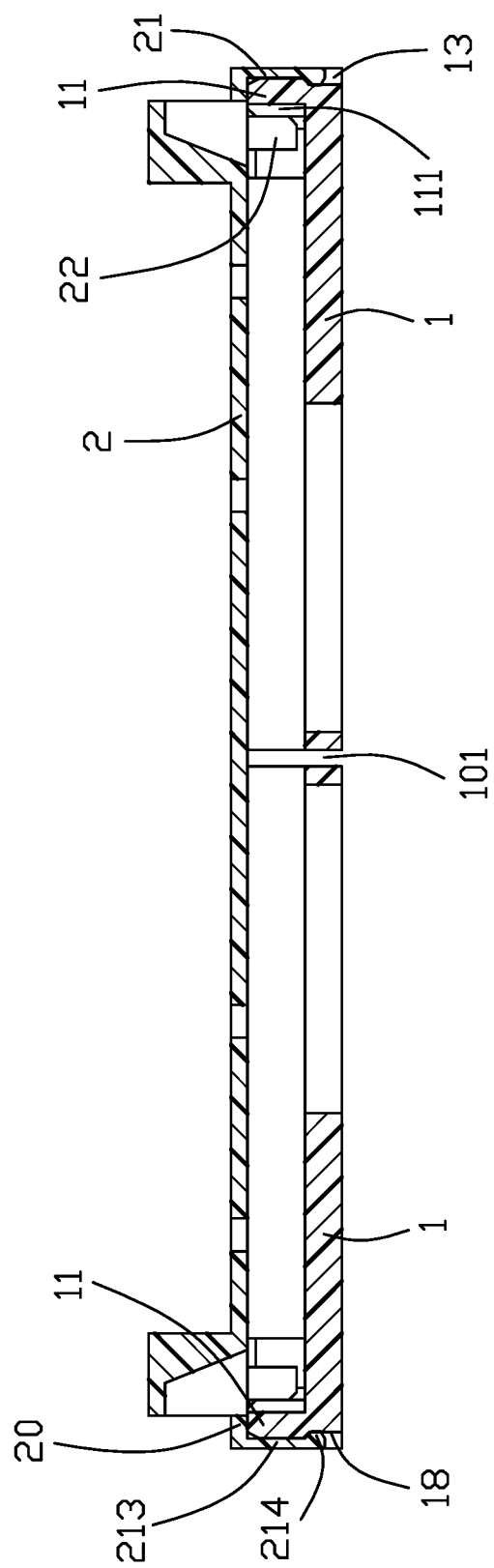
FIG. 7 is another cross-sectional view of the electrical connector assembly of FIG. 1 to shown how the positioning blocks cooperate with the claws to sandwich the corresponding periphery wall of the half housing therebetween in the longitudinal direction for securement.

Referring to FIGS. 5-7, in each half housing 1, around the corresponding corners, the first side wall 11 forms a pair of first alignment blocks 111 and the pair of second side wall 12 forms a pair of second alignment blocks 121, respectively. Notably, the pair of first alignment blocks 111 and the pair of second alignment blocks 121 are used to properly align the CPU in both the longitudinal direction and the transverse direction during loading the CPU into the receiving cavity 10. In this embodiment, on one hand, the positioning blocks 22 abut against the corresponding alignment blocks 111 in the longitudinal direction so as to cooperate with the first claw 211 to sandwich the first side wall 11 therebetween in the longitudinal direction for securing the pick-up cap 2 and the half housing 1 together in the longitudinal direction. On the other hand, the pair of second claws 212 commonly sandwich the half housing 1 in the transverse direction for securing the pick-up cap 2 and the half housing 1 together in the transverse direction. Understandably, the engagement between the locking head 214 and the locking recess 13, 14 providing securement in the vertical direction.

The plate 20 of the pick-up cap 2 provides a suction plane 201 for use with a suction machine for mounting the connector 100 upon the PCB. The suction plane 201 includes a plurality of vents 202 for heat dissipation. A pair of protrusions 203 for hand grasping.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
an electrical connector including a pair of insulative half housings discrete from and opposite to each other with a gap therebetween in a longitudinal direction to commonly form a receiving cavity;
each of the half housings including a first side wall extending along a transverse direction perpendicular to the longitudinal direction, and a pair of second side walls extending in the longitudinal direction to commonly form a U-shaped periphery wall in a top view, the U-shaped periphery walls of said pair of half housings being essentially symmetrically arranged with each other by two sides the gap in the longitudinal direction;
in each of the half housings, the first side wall forming a locking recess in an exterior face; and
a one-piece pick-up cap including:
a plate dimensioned to cover both the half housings in both the longitudinal direction and the transverse direction, and
around corresponding edge regions of the plate, a pair of first claws each downwardly extending from the plate to engage the corresponding locking recess of the first side wall of the half housing, and a plurality of positioning blocks each downwardly extending from the plate into the receiving cavity to cooperate with the corresponding first claw for snugly sandwiching the corresponding first side wall therebetween in the longitudinal direction, whereby the pick-up cap is capable of securing the pair of half housings, respectively and independently simultaneously disregarding the gap between the pair of half housings.

2. The electrical connector assembly as claimed in claim 1, wherein in each of the half housings, the first side walls further forms a pair of first alignment blocks in the receiving cavity around a corner of the U-shaped periphery wall, and the positioning blocks abut against the corresponding first alignment blocks in the longitudinal direction, respectively.

3. The electrical connector assembly as claimed in claim 1, wherein the first claw and the corresponding positioning block are not aligned with each other in the longitudinal direction.

4. The electrical connector assembly as claimed in claim 3, wherein corresponding to the first side wall, the two positioning blocks are symmetrically located by two sides of the corresponding first claw which is located at a longitudinal centerline of the half housing.

5. The electrical connector assembly as claimed in claim 1, wherein in each of the half housings, no side wall is formed around the gap so as to assure no interruption of the receiving cavity in the longitudinal direction.

6. The electrical connector assembly as claimed in claim 1, wherein in each of the half housings, the pair of second side walls form a pair of second locking recesses, respectively, and the pick-up cap forms two pairs of second claws respectively engage the corresponding second locking recesses of both half housings, respectively.

7. The electrical connector assembly as claimed in claim 6, wherein the exterior faces of the first side wall and the second side wall keep even and smooth when the first claw and the second claw are received in the corresponding first locking recess and the second locking recess.

8. The electrical connector assembly as claimed in claim 1, wherein the positioning blocks are located around corners of the plate.

9. The electrical connector assembly as claimed in claim 1, wherein each of the first locking recesses includes a first oblique upward guiding face and a first abutting face in an upper portion thereof, and a second oblique downward locking face and a second abutting face in a lower portion thereof.

10. The electrical connector assembly as claimed in claim 9, wherein each first claw includes a spring arm and a locking head at the bottom end thereof, and the locking head includes an oblique upward locking face corresponding to the oblique downward locking face, and an oblique downward guiding face corresponding to the oblique upward guiding face.

11. An electrical connector assembly comprising:
an electrical connector including a pair of insulative half housings discrete from and opposite to each other in a longitudinal direction to commonly form a receiving cavity;
each of the half housings including a first side wall extending along a transverse direction perpendicular to the longitudinal direction, and a pair of second side walls extending in the longitudinal direction to commonly form a U-shaped periphery wall in a top view;
in each of the half housings, the first side wall forming a locking recess in an exterior face; and
a one-piece pick-up cap including:
a plate dimensioned to cover both the half housings in both the longitudinal direction and the transverse direction, and
around corresponding edge regions of the plate, a pair of first claws each downwardly extending from the plate to engage the corresponding locking recess of the first side wall of the half housing, and a plurality of positioning blocks each downwardly extending from the plate into the receiving cavity to cooperate with the corresponding first claw for snugly sandwiching the corresponding first side wall therebetween in the longitudinal direction so as to secure the half housing to the pick-up cap in the longitudinal direction, wherein
in each of the half housings, the pair of second side walls form a pair of second locking recesses in corresponding exterior faces, respectively, and the pick-up cap forms two pairs of second claws respectively engage the corresponding second locking recesses of both half housings, respectively, so as to secure the half housings to the pick-up cap in the transverse direction.

12. The electrical connector assembly as claimed in claim 11, wherein the positioning blocks are located at four corners of the plate.

13. The electrical connector assembly as claimed in claim 12, wherein in each of the half housings, the first side wall forms a pair of first alignment blocks in the receiving cavity around two corners of the U-shaped periphery wall, and the positioning blocks abut against the corresponding first alignment blocks in the longitudinal direction, respectively.

14. The electrical connector assembly as claimed in claim 11, wherein the exterior faces of both the first side wall and the second side wall keep even and smooth when the first claw and the second claw are received within the corresponding first locking recess and the second locking recess.

15. A method of assembling a pick-up cap to an electrical connector, comprising steps of:
providing a pair of insulative half housings which are discrete from each other, each half housing including a first side wall extending along a transverse direction perpendicular to the longitudinal direction, and a pair of second side walls extending in the longitudinal direction to commonly form a U-shaped periphery wall in a top view;
forming a first locking recess in an exterior face of the first side wall;
forming a second locking recess in each second side wall;
providing a one piece pick-up cap with a plate and a pair of first claws on opposite short sides and two pairs of second claws on opposite long sides, and at least one pair of positioning blocks around the opposite short sides; wherein
the pick-up cap is assembled upon both the pair of half housings with the first claws are engaged within the corresponding first locking recesses, the second claws are engaged within the corresponding second locking recesses, and the positioning blocks are received within the receiving cavity to cooperate with the corresponding first claws to sandwiched the corresponding first side walls therebetween in the longitudinal direction for securement whereby the pair of half housing are capable of being secured to the pick-up cap independently and individually without mutual influence.

16. The method as claimed in claim 15, wherein the positioning blocks are located on four corners of the receiving cavity.

17. The method as claimed in claim 15, wherein the exterior faces of the first side walls and the second side walls keep even and smooth when the first claws are received within the first locking recesses and the second claws are received within the corresponding second locking recesses.

18. The method as claimed in claim 15, wherein the first locking recess is located at a longitudinal centerline of the half housing.

19. The method as claimed in claim 15, wherein a gap is formed between the pair of half housings in the longitudinal direction.

\* \* \* \* \*